(12) United States Patent
Hoegerl et al.

(10) Patent No.: US 10,699,976 B1
(45) Date of Patent: Jun. 30, 2020

(54) SEMICONDUCTOR MODULE WITH EXTERNAL POWER SENSOR

(71) Applicant: Infineon Technologies AG, Neubiberg (DE)

(72) Inventors: Juergen Hoegerl, Regensburg (DE); Leo Aichriedler, Puch (AT); Christian Schweikert, Munich (DE); Gerald Wriessnegger, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/260,405

(22) Filed: Jan. 29, 2019

(51) Int. Cl.
| H01L 27/22 | (2006.01) |
| H01L 21/66 | (2006.01) |
| H01L 23/057 | (2006.01) |
| H01L 23/31 | (2006.01) |
| H01L 23/367 | (2006.01) |

(Continued)

(52) U.S. Cl.
CPC .......... *H01L 22/34* (2013.01); *H01L 21/4817* (2013.01); *H01L 21/4871* (2013.01); *H01L 21/565* (2013.01); *H01L 23/057* (2013.01); *H01L 23/3121* (2013.01); *H01L 23/3675* (2013.01); *H01L 23/3735* (2013.01); *H01L 23/50* (2013.01); *H01L 25/072* (2013.01);

(Continued)

(58) Field of Classification Search
CPC .................................................. H01L 2924/181
See application file for complete search history.

(56) References Cited

U.S. PATENT DOCUMENTS

| 6,819,095 B1 | 11/2004 | Dubhashi et al. |
| 7,199,435 B2 | 4/2007 | Elbanhawy |

(Continued)

FOREIGN PATENT DOCUMENTS

| CN | 1460184 A | 12/2003 |
| DE | 102007044485 A1 | 4/2009 |

(Continued)

OTHER PUBLICATIONS

"Coreless Current Sensor for High Current Power Module", U.S. Appl. No. 15/878,982, filed Jan. 24, 2018.

(Continued)

*Primary Examiner* — Thao P Le
(74) *Attorney, Agent, or Firm* — Murphy, Bilak & Homiller, PLLC (57) ABSTRACT

A semiconductor module includes a semiconductor die, a mold compound encasing the semiconductor die, a plurality of terminals electrically connected to the semiconductor die and protruding out of the mold compound, wherein a first one of the terminals has a constricted region covered by the mold compound, wherein the mold compound has a recess or an opening near the constricted region of the first terminal, and a coreless magnetic field sensor disposed in the recess or the opening of the mold compound and isolated from the first terminal by the mold compound. The coreless magnetic sensor is configured to generate a signal in response to a magnetic field produced by current flowing in the constricted region of the first terminal. The magnitude of the signal is proportional to the amount of current flowing in the constricted region of the first terminal. A method of manufacturing the module also is described.

21 Claims, 10 Drawing Sheets

(51) Int. Cl.
*H01L 23/373* (2006.01)
*H01L 23/50* (2006.01)
*H01L 25/00* (2006.01)
*H01L 43/06* (2006.01)
*H01L 43/08* (2006.01)
*H01L 21/48* (2006.01)
*H01L 21/56* (2006.01)
*H01L 25/07* (2006.01)

(52) U.S. Cl.
CPC .............. *H01L 25/50* (2013.01); *H01L 43/06* (2013.01); *H01L 43/08* (2013.01)

(56) References Cited

U.S. PATENT DOCUMENTS

| | | | |
|---|---|---|---|
| 9,564,423 | B2 | 2/2017 | Chen et al. |
| 9,678,173 | B2 | 6/2017 | Castro Serrato |
| 2004/0217451 | A1 | 11/2004 | Lee et al. |
| 2006/0226826 | A1 | 10/2006 | Teppan |
| 2007/0290337 | A1 | 12/2007 | Otremba et al. |
| 2011/0304327 | A1 | 12/2011 | Ausserlechner |
| 2012/0267730 | A1 | 10/2012 | Renard et al. |
| 2013/0105961 | A1 | 5/2013 | Jones et al. |
| 2013/0264721 | A1* | 10/2013 | Landau .................. H01L 24/29 257/777 |
| 2013/0307156 | A1 | 11/2013 | Bayerer |
| 2014/0327436 | A1* | 11/2014 | Castro Serrato ....... G01R 33/07 324/252 |
| 2016/0341571 | A1* | 11/2016 | Sun ........................ G01D 5/142 |
| 2017/0314969 | A1* | 11/2017 | Ausserlechner ....... G01D 5/147 |

FOREIGN PATENT DOCUMENTS

| | | |
|---|---|---|
| DE | 102013103351 A1 | 10/2013 |
| DE | 102014106133 A1 | 11/2014 |
| JP | 2006038640 A | 2/2006 |

OTHER PUBLICATIONS

"Current Sensing Using Linear Hall Sensors", Application Note, Rev. 1.1, Infineon Technologies AG, Feb. 3, 2009.
"Dynamic Differential Hall Effect Sensor IC (TLE 4923)", Data Sheet, Infineon Technologies AG, Jul. 1, 2000.
Schrieber-Prillwitz, Wolfgang, et al., "Architecture of an Integrated AMR Current Sensor (IACS) System for a Wide Range of Automotive Applications", Sensor+Test Conferences 2011, Sensor Proceedings, pp. 774-779.

\* cited by examiner

SEMICONDUCTOR MODULE WITH EXTERNAL POWER SENSOR

BACKGROUND

Accurate operation of inverter packages or modules requires current sensing of the AC current to ensure effective system performance. AC current sensing is typically implemented using core-based magnetic sensors. Open-loop, core-based current sensors are limited in performance especially due to negative effects of the iron core. For example, open-loop, core-based current sensors suffer from hysteresis, saturation, non-linearity, temperature-dependent permeability, eddy current effects, etc. Some of the issues can be addressed using an external circuit for compensating the magnetic flux generated by the test current, and a probe for determining the zero-flux condition in the airgap. However, the additional circuitry, compensation winding and additional power dissipation in the compensation winding add significant cost to the overall sensing implementation.

In most cases, the intrinsic accuracy of core-based sensors is insufficient to meet end-customer requirements, e.g. for automotive traction inverters. Therefore, an end-of-line calibration may be required to compensate for gain and offset errors of the sensor. This calibration step is expensive since it requires to force high currents at high accuracy after the assembly of the inverter module and the current sensor. Since the calibration step is usually only performed at room temperature, the residual error due to lifetime drift and temperature dependency remains significant and impacts the overall system performance.

Thus, there is a need for an improved external power sensor for semiconductor modules.

SUMMARY

According to an embodiment of a semiconductor module, the semiconductor module comprises: a semiconductor die; a mold compound encasing the semiconductor die; a plurality of terminals electrically connected to the semiconductor die and protruding out of the mold compound, wherein a first one of the terminals has a constricted region covered by the mold compound, wherein the mold compound has a recess or an opening near the constricted region of the first terminal; and a coreless magnetic field sensor disposed in the recess or the opening of the mold compound and isolated from the first terminal by the mold compound, the coreless magnetic sensor configured to generate a signal in response to a magnetic field produced by current flowing in the constricted region of the first terminal, the magnitude of the signal being proportional to the amount of current flowing in the constricted region of the first terminal.

The coreless magnetic field sensor may be a magnetoresistive sensor or a Hall sensor.

Separately or in combination, the constricted region of the first terminal may comprise a tapered region over which the width of the first terminal narrows, the recess of the mold compound may be near the tapered region of the first terminal, the coreless magnetic field sensor may be a single-ended sensor disposed in the recess of the mold compound and comprise a single sensing element positioned adjacent one side of the tapered region, and the single sensing element maybe isolated from the tapered region by the mold compound.

Separately or in combination, the constricted region of the first terminal may comprise a tapered region over which the width of the first terminal narrows, the recess of the mold compound may be near the tapered region of the first terminal, the coreless magnetic field sensor may be a differential sensor disposed in the recess of the mold compound and comprise a first sensing element positioned adjacent a first side of the tapered region and a second sensing element positioned adjacent a second side of the tapered region opposite the first side, and the first and second sensing elements may be isolated from the tapered region by the mold compound.

Separately or in combination, the constricted region of the first terminal may comprise a serpentine region, the recess of the mold compound may be near the serpentine region of the first terminal, wherein the coreless magnetic field sensor is a single-ended sensor disposed in the recess of the mold compound and comprises a single sensing element positioned adjacent one side of the serpentine region, and wherein the single sensing element is isolated from the serpentine region by the mold compound.

Separately or in combination, the constricted region of the first terminal may comprise a serpentine region, the recess of the mold compound may be near the serpentine region of the first terminal, the coreless magnetic field sensor may be a differential sensor disposed in the recess of the mold compound and comprise a first sensing element positioned adjacent a first side of the serpentine region and a second sensing element positioned adjacent a second side of the serpentine region opposite the first side, and the first and second sensing elements may be isolated from the serpentine region by the mold compound.

Separately or in combination, the constricted region of the first terminal may comprise a region of the first terminal having an opening, the opening of the mold compound may be aligned with the opening in the first terminal, the coreless magnetic field sensor may be a single-ended sensor disposed in the opening of the mold compound and comprise a single sensing element positioned above or below the opening in the first terminal, and the single sensing element may be isolated from a sidewall of the opening in the first terminal by the mold compound.

Separately or in combination, the constricted region of the first terminal may comprise a region of the first terminal having an opening, the opening of the mold compound may be aligned with the opening in the first terminal, the coreless magnetic field sensor may be a differential sensor disposed in the opening of the mold compound and comprise a first sensing element positioned above the opening in the first terminal and a second sensing element positioned below the opening in the first terminal, and the first and second sensing elements may be isolated from a sidewall of the opening in the first terminal by the mold compound.

Separately or in combination, the mold compound may have a protrusion which covers more of the first terminal than other ones of the terminals protruding from a same side of the mold compound as the first terminal, and the recess or the opening of the mold compound may be formed in the protrusion.

Separately or in combination, the semiconductor die may be a power semiconductor die, the semiconductor module may have double-sided cooling, and the first terminal may be an AC output terminal of the power semiconductor die.

According to an embodiment of a cooling system, the cooling system comprises: a plurality of individual semiconductor modules each comprising: a semiconductor die; a mold compound encasing the semiconductor die; a plurality of terminals electrically connected to the semiconductor die and protruding out of the mold compound, wherein a first one of the terminals has a constricted region covered by the mold compound, wherein the mold compound has a recess or an opening near the constricted region of the first terminal; and a coreless magnetic field sensor disposed in the recess or the opening of the mold compound and isolated from the first terminal by the mold compound, the coreless magnetic sensor configured to generate a signal in response to a magnetic field produced by current flowing in the constricted region of the first terminal, the magnitude of the signal being proportional to the amount of current flowing in the constricted region of the first terminal; and a first lid joined to a second lid to form a sealed housing which includes the plurality of individual semiconductor modules and a cavity between the lids and the individual semiconductor modules for fluid flow via a plurality of ports formed in the first and/or second lid.

Each coreless magnetic field sensor of the cooling system may be a magnetoresistive sensor or a Hall sensor.

Separately or in combination, the constricted region of each first terminal may comprise a tapered region over which the width of the first terminal narrows, the recess of the mold compound may be near the tapered region of the first terminal, the coreless magnetic field sensor may be a single-ended sensor disposed in the recess of the mold compound and comprise a single sensing element positioned adjacent one side of the tapered region, and the single sensing element may be isolated from the tapered region by the mold compound.

Separately or in combination, the constricted region of each first terminal may comprise a tapered region over which the width of the first terminal narrows, the recess of the mold compound may be near the tapered region of the first terminal, the coreless magnetic field sensor may be a differential sensor disposed in the recess of the mold compound and comprise a first sensing element positioned adjacent a first side of the tapered region and a second sensing element positioned adjacent a second side of the tapered region opposite the first side, and the first and second sensing elements may be isolated from the tapered region by the mold compound.

Separately or in combination, the constricted region of each first terminal may comprise a serpentine region, the recess of the mold compound may be near the serpentine region of the first terminal, the coreless magnetic field sensor may be a single-ended sensor disposed in the recess of the mold compound and comprise a single sensing element positioned adjacent one side of the serpentine region, and the single sensing element may be isolated from the serpentine region by the mold compound.

Separately or in combination, the constricted region of each first terminal may comprise a serpentine region, the recess of the mold compound may be near the serpentine region of the first terminal, the coreless magnetic field sensor may be a differential sensor disposed in the recess of the mold compound and comprise a first sensing element positioned adjacent a first side of the serpentine region and a second sensing element positioned adjacent a second side of the serpentine region opposite the first side, and the first and second sensing elements may be isolated from the serpentine region by the mold compound.

Separately or in combination, the constricted region of each first terminal may comprise a region of the first terminal having an opening, the opening of the mold compound may be aligned with the opening in the first terminal, the coreless magnetic field sensor may be a single-ended sensor disposed in the opening of the mold compound and comprise a single sensing element positioned above or below the opening in the first terminal, and the single sensing element may be isolated from a sidewall of the opening in the first terminal by the mold compound.

Separately or in combination, the constricted region of each first terminal may comprise a region of the first terminal having an opening, the opening of the mold compound may be aligned with the opening in the first terminal, the coreless magnetic field sensor may be a differential sensor disposed in the opening of the mold compound and comprise a first sensing element positioned above the opening in the first terminal and a second sensing element positioned below the opening in the first terminal, and the first and second sensing elements may be isolated from a sidewall of the opening in the first terminal by the mold compound.

Separately or in combination, the mold compound of each individual semiconductor module may have a protrusion which covers more of the first terminal than other ones of the terminals protruding from a same side of the mold compound as the first terminal, and the recess or the opening of the mold compound may be formed in the protrusion.

Separately or in combination, each semiconductor die may be a power semiconductor die, wherein each individual semiconductor module has double-sided cooling, and each first terminal may be an AC output terminal of the power semiconductor die.

According to an embodiment of a method of manufacturing a semiconductor module, the method comprises: electrically connecting a plurality of terminals to a semiconductor die; molding the plurality of terminals and the semiconductor die so that the semiconductor die is encased in a mold compound and the plurality of terminals protrude out of the mold compound, wherein a first one of the terminals has a constricted region covered by the mold compound, wherein the mold compound has a recess or an opening near the constricted region of the first terminal; and placing a coreless magnetic field sensor in the recess or the opening of the mold compound, the coreless magnetic field sensor being isolated from the first terminal by the mold compound and configured to generate a signal in response to a magnetic field produced by current flowing in the constricted region of the first terminal, the magnitude of the signal being proportional to the amount of current flowing in the constricted region of the first terminal.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein integrate a coreless, open-loop current sensor into the package of a power module. A terminal of the power module has a sensing structure that generates a magnetic field used for current sensing, and the molded body of the package is designed such that the coreless current sensor can be mounted and aligned towards the sensing structure. Since the coreless sensor does not have an iron core, the corresponding negative effects (e.g. temperature dependency, hysteresis, etc.) are not present. To suppress external stray fields, the design may be implemented as a differential sensing concept. To implement a differential design, the coreless current sensor may be aligned in multiple ways relative to the current rail. Both lateral and vertical integration of the sensor are described herein. The sensor implementation may instead be single-ended, e.g., in the case of low-noise applications. The molded body of the module is configured to receive the coreless magnetic field sensor such that the current sensor is positioned either above or below the terminal or in the terminal. The molded module body may be configured to isolate the current sensor from the terminal being sensed.

Figure 1:
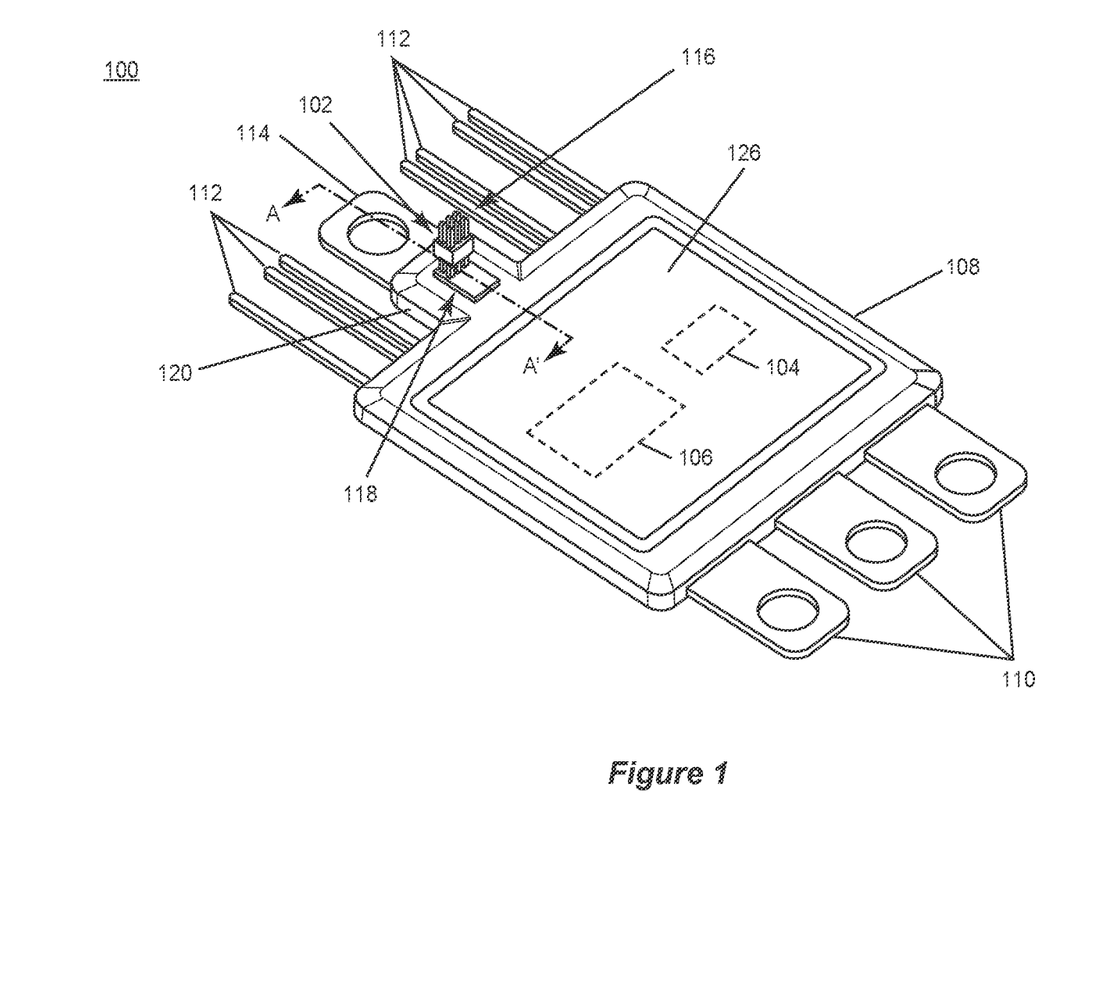
FIG. 1 illustrates perspective view of an embodiment of a semiconductor module having a coreless magnetic field sensor.

FIG. 1 illustrates an embodiment of a semiconductor module 100 with an integrated, coreless, open-loop current sensor 102. The semiconductor module 100 includes one or more semiconductor dies 104, 106 such as a power MOSFET (metal-oxide-semiconductor field-effect transistor), HEMT (high-electron mobility transistor), IGBT (insulated gate bipolar transistor), JFET (junction FET) or similar device. In one embodiment, the one or more semiconductor dies 104, 106 are SiC dies which do not have internal current sense capability. The one or more semiconductor dies 104, 106 are encased by a mold compound 108 and therefore out of view in FIG. 1 and illustrated by respective dashed boxes.

The semiconductor module 100 also includes a plurality of terminals 110, 112, 114 electrically connected to the one or more semiconductor dies 104, 106 and protruding out of the mold compound 108. For example, the terminals 110, 112, 114 may be electrically connected to the one or more semiconductor dies 104, 106 by wire bonds, metal ribbons, metal clips, etc. In one embodiment, the terminals 110, 112, 114 are leads of a lead frame. In another embodiment, at least the power terminals 110, 114 are busbars or tabs. Still other types of terminals may be used. Different types of terminals may be used in the same module. For example, leadframe-type terminals may be used for the control and/or sensing connections and busbar or tab type terminals may be used for power connections. The number and type of terminals 110, 112, 114 provided depends on the type of semiconductor module.

For example, in the case of a half-bridge power semiconductor module, a high-side semiconductor die 104 and a low-side semiconductor die 106 are encased by the mold compound 108. A first group of terminals 112 of the semiconductor module 100 may be control and sense terminals, for providing control signals to the high-side and low-side semiconductor dies 104, 106 and for receiving telemetry data from the module 100 such as current sense information, temperature sense information, etc. The high-side and low-side semiconductor dies 104, 106 may be SiC dies which do not have internal current sense capability. A second group of terminals 110 are DC supply terminals, for providing positive and negative (or ground) potentials to the high-side and low-side semiconductor dies 104, 106. The high-side and low-side semiconductor dies 104, 106 are electrically coupled in series at a common output node. Another terminal 114 is an AC output terminal electrically connected to the common output node of the dies 104, 106.

The AC output terminal 114 has a constricted region covered by the mold compound 108. The constricted region is out of view in FIG. 1.

The coreless magnetic field sensor 102 integrated in the semiconductor module 100 is configured to generate a signal in response to a magnetic field produced by current flowing in the constricted region of the AC output terminal 114 of the module 100. The coreless magnetic field sensor 102 has one or more terminals 116 such as pins, leads, etc. for accessing the signal generated by the sensor 102. The coreless magnetic field sensor 102 may be calibrated during an end-of-line test procedure performed on the semiconductor module 100 prior to shipment. Doing so yield improved accuracy compared to a customer calibration process, since the end-of-line test procedure is performed in a controlled environment with multi-temperature calibration capability and may omit high current calibration steps which are typically performed in the field.

The magnitude of the signal generated by the coreless magnetic field sensor 102 is proportional to the amount of current flowing in the constricted region of the AC output terminal 114. Any type of coreless magnetic field sensor may be used. In one embodiment, the coreless magnetic field sensor 102 is a magnetoresistive (XMR) sensor such as an anisotropic magnetoresistive (AMR) sensor, giant magnetoresistive (GMR) sensor or tunnel magnetoresistive (TMR) sensor. In the case of an XMR sensor, the electric resistivity of a metal, semi-metal or semiconductor included in the sensor 102 changes under the influence of a magnetic field and in proportion to the amount of current flowing in the constricted region of the AC output terminal 114. In another embodiment, the coreless magnetic field sensor 102 is a Hall sensor. In the case of a Hall sensor, a transducer included in the sensor 102 has an output voltage which varies in response to the magnetic field and in proportion to the amount of current flowing in the constricted region of the AC output terminal 114.

According to the embodiment illustrated in FIG. 1, the mold compound 108 has a recess 118 near the constricted region of the AC output terminal 114. The coreless magnetic field sensor 102 is disposed in the recess 118 of the mold compound 108. In one embodiment, the mold compound 108 has a protrusion 120 which covers more of the AC output terminal 114 than other ones of the terminals 112 protruding from the same side of the mold compound 108 as the AC output terminal 114. The recess 118 of the mold compound 108 is formed in the protrusion 120.

Figure 2:
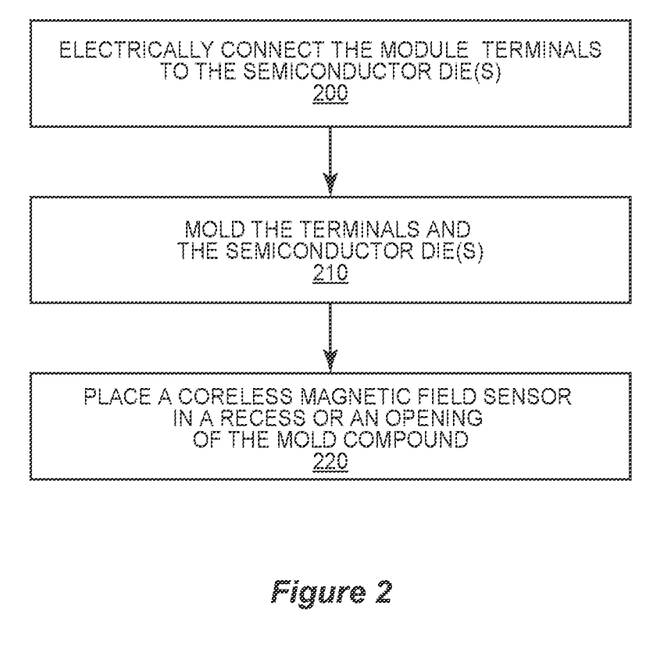
FIG. 2 illustrates a flow diagram of an embodiment of a method of manufacturing the semiconductor module shown in FIG. 1.

FIG. 2 illustrates an embodiment of a method of manufacturing the semiconductor module 100 shown in FIG. 1. The method includes electrically connecting the terminals 110, 112, 114 to the one or more semiconductor dies 104, 106 (Block 200). For example, the terminals 110, 112, 114 may be electrically connected to the one or more semiconductor dies 104, 106 by wire bonding, metal ribbons, metal clips, etc. The method further includes molding the terminals 110, 112, 114 and the one or more semiconductor dies 104, 106 so that the one or more semiconductor dies 104, 106 are encased in the mold compound 108 and the terminals 110, 112, 114 protrude out of the mold compound 108, the AC output terminal 114 has a constricted region covered by the mold compound 108, and the mold compound 108 has a recess 118 near the constricted region of the AC output terminal 114 (Block 210). Any typical molding process may be used such as injection molding, film-assisted molding, transfer molding, etc. A pin in a mold tool may be used to form the protrusion 120 of the mold compound 108. The method also includes placing the coreless magnetic field sensor 102 in the recess 118 of the mold compound 108 (Block 220). The coreless magnetic field sensor 102 may be secured in the recess by glue, adhesive tape, etc., or clipped in place by the shape and features of the recess 118.

Figure 3A:
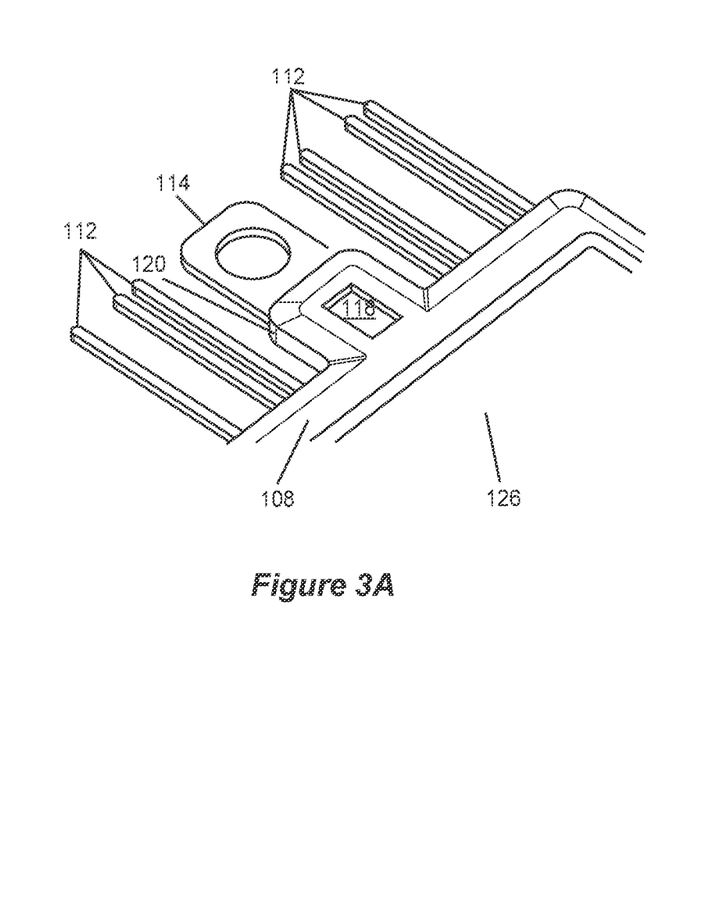
FIG. 3A illustrates an enlarged view of a section of the semiconductor module of FIG. 1 before the coreless magnetic field sensor is disposed in a recess of the mold compound.
Figure 3B:
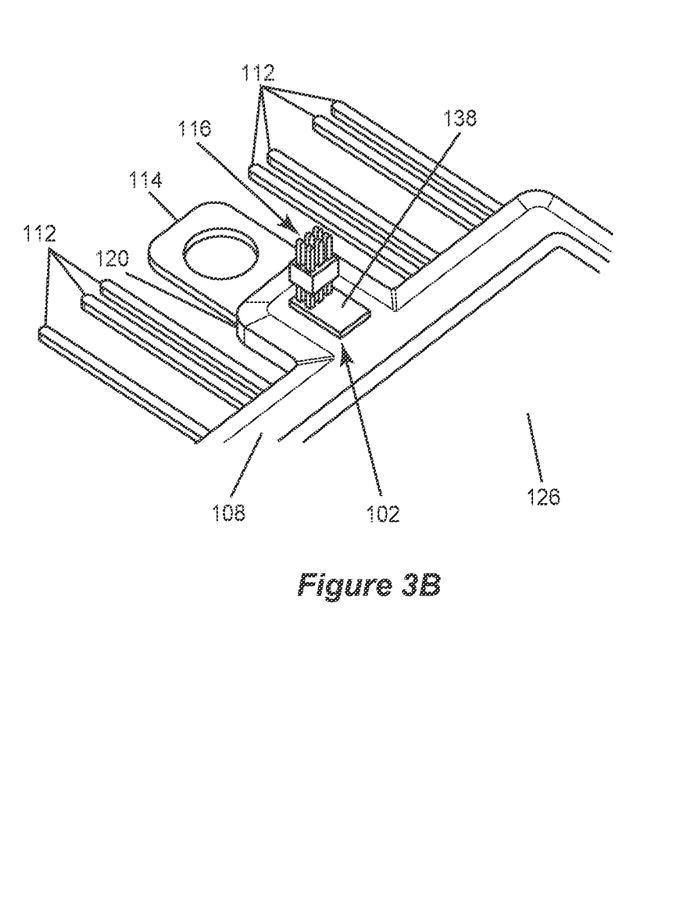
FIG. 3B shows the same view of the semiconductor module as in FIG. 3A, but after the coreless magnetic field sensor is disposed in the recess.
Figure 3C:
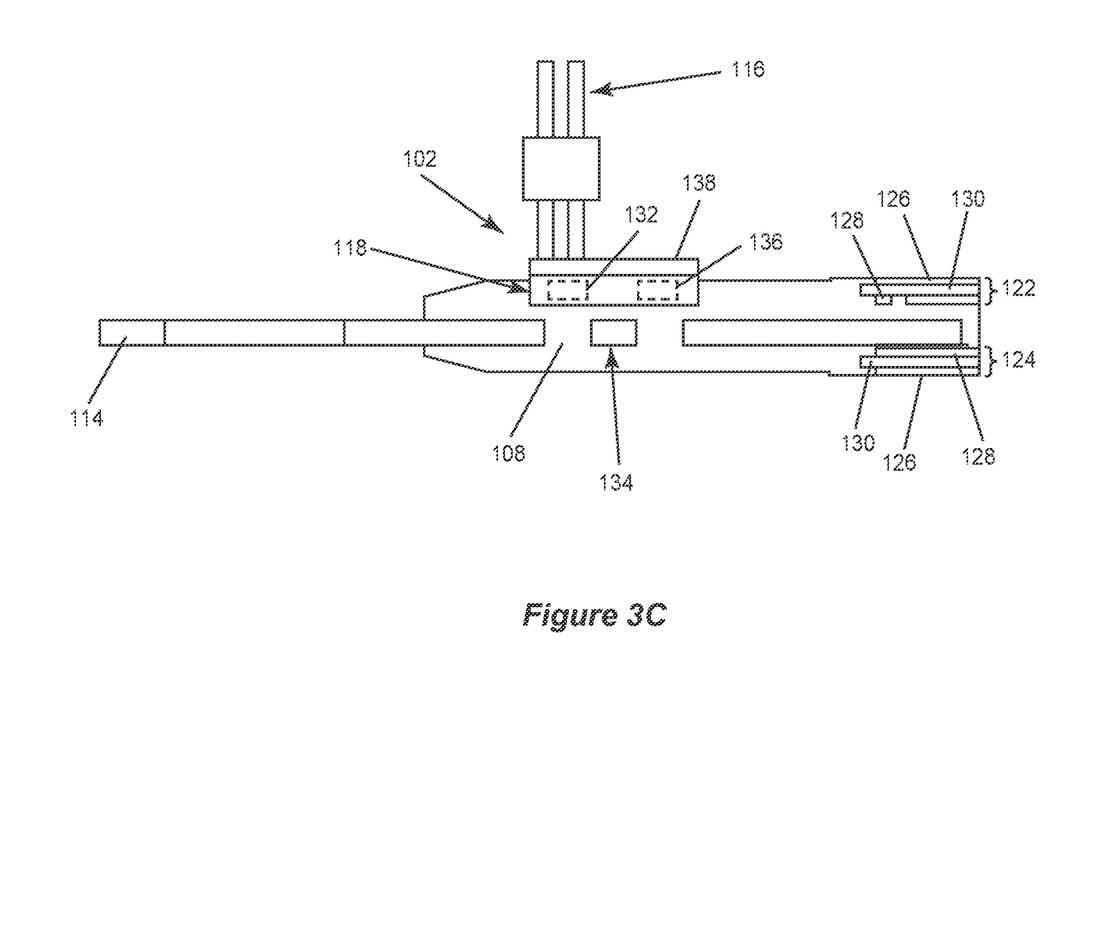
FIG. 3C illustrates a partial cross-sectional view of the semiconductor module along the line labelled A-A' in FIG. 1.

FIG. 3A illustrates an enlarged view of a section of the semiconductor module 100 before the coreless magnetic field sensor 102 is disposed in the recess 118 of the mold compound 108. FIG. 3B shows the same view of the semiconductor module 100 as in FIG. 3A, but after the coreless magnetic field sensor 102 is disposed in the recess 118. FIG. 3C illustrates a partial cross-sectional view of the semiconductor module 100 along the line labelled A-A' in FIG. 1. The semiconductor module 100 may include a first substrate 122 such as a PCB (printed circuit board) or DCB (direct copper bonded) substrate to which the high-side power semiconductor die 104 (out of view in FIG. 3C) is attached and a second substrate 124 such as a PCB or DCB substrate to which the low-side power semiconductor die 106 (also out of view in FIG. 3C). With this configuration, the semiconductor module 100 may have double-sided cooling.

For example, in the case of an arrangement of stacked DCB substrates 122, 124, each DCB substrate 122, 124 has two metallized surfaces 126, 128 separated by an insulative substrate 130 such as ceramic. The top-metallized side 126 of the upper DCB substrate 122 provides cooling at one side of the semiconductor module 100, whereas the bottom-metallized side 126 of the lower DCB substrate 124 provides cooling at the opposite side of the module 100. Double-sided cooling may also be realized by using PCB substrates 122, 124. Double-side cooling is advantageous for high power applications such as automotive power electronics. The one or more semiconductor dies 104, 106 may be attached to the same substrate instead of separate substrates.

Further according to the embodiment shown in FIG. 3C, the coreless magnetic field sensor 102 may be a single-ended or differential sensor disposed in the recess 118 of the mold compound 108. In the case of a differential sensor, the coreless magnetic field sensor 102 has a first sensing element 132 positioned adjacent a first side of the constricted region 134 of the AC output terminal 114 and a second sensing element 136 positioned adjacent a second side of the constricted region 134 opposite the first side. The differential coreless magnetic field sensor 102 generates a signal which is a linear function of the differential flux density of the magnetic field passing through the first and second sensing elements 132, 136. One of the sensing elements 132, 136 may be omitted, for example in low-noise applications, to yield a single-ended coreless magnetic field sensor 102. In this embodiment, a single sensing element 132 (or 136) is positioned adjacent one side of the constricted region 134 of the AC output terminal 114 of the semiconductor module 100. In either the differential or single-ended case, the sensing element(s) 132, 136 of the coreless magnetic field sensor 102 may be attached to a substrate 138 such as a PCB to which the terminals 116 of the sensor 102 are also attached. In both cases, each sensing element 132, 136 of the coreless magnetic field sensor 102 is isolated from the constricted region 134 of the AC output terminal 114 by the mold compound 108 to ensure proper electrical isolation and accurate sensing of the current flowing in the constricted region 134 of the terminal 114.

Figure 4:
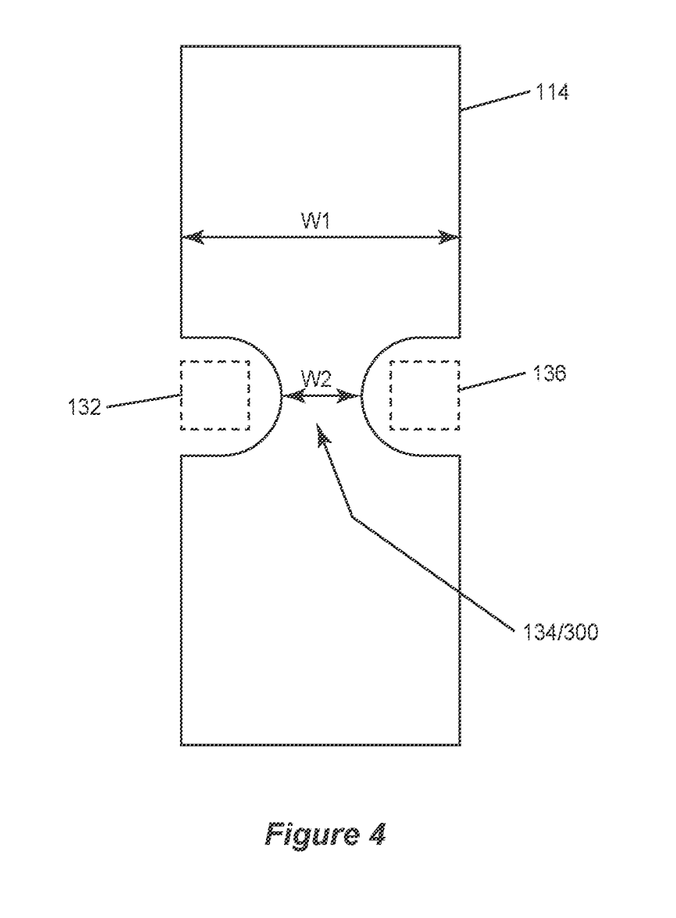
FIG. 4 illustrates a top plan view of an embodiment of a terminal of the semiconductor module of FIG. 1 having a constricted region in close proximity to the coreless magnetic field sensor.

FIG. 4 illustrates an embodiment of the part of the AC output terminal 114 covered by the mold compound 108 and having the constricted region 134. The mold compound 108 is not shown in FIG. 4 to provide an unobstructed view of the constricted region 134. According to this embodiment, the constricted region 134 of the AC output terminal 114 is a tapered region 300 over which the width of the terminal 114 narrows from a larger width W1 to a smaller width W2. In the case of a differential coreless magnetic field sensor 102, the sensor 102 has sensing elements 132, 136 positioned adjacent opposite sides of the tapered region 300 of the AC output terminal 114. In the case of a single-ended coreless magnetic field sensor 102, one of the sensing elements 132 (or 136) shown in FIG. 4 is omitted. In either case, the recess 118 of the mold compound 108 is near the tapered region 300 of the AC output terminal 114 and the (differential or single-ended) coreless magnetic field sensor 102 is disposed in the recess 118 of the mold compound 108, e.g., as shown in FIG. 1 and FIGS. 3A-3C.

Figure 5:
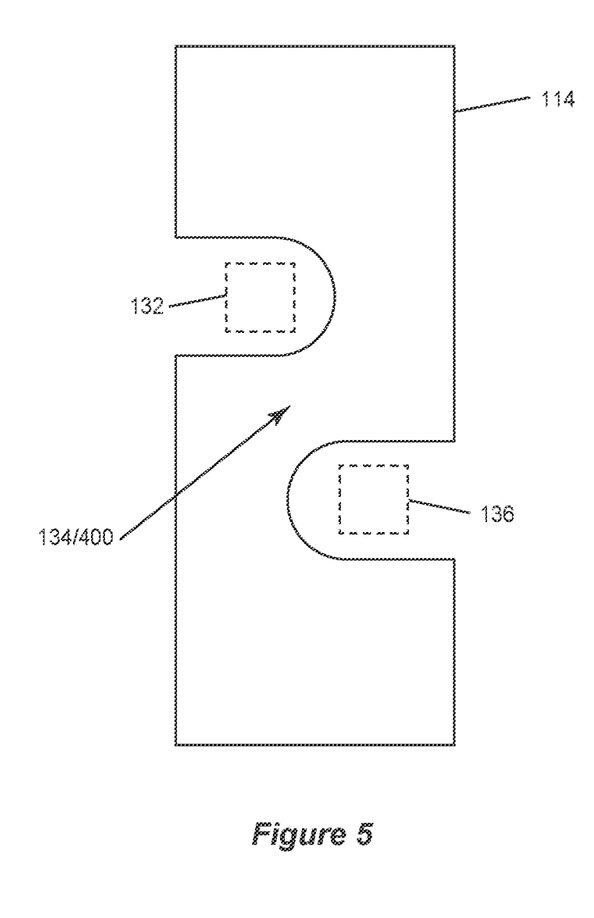
FIG. 5 illustrates a top plan view of another embodiment of a terminal of the semiconductor module of FIG. 1 having a constricted region in close proximity to the coreless magnetic field sensor.

FIG. 5 illustrates another embodiment of the part of the AC output terminal 114 covered by the mold compound 108 and having the constricted region 134. The mold compound 108 is not shown in FIG. 5 to provide an unobstructed view of the constricted region 134. According to this embodiment, the constricted region 134 of the AC output terminal 114 is a serpentine region 400 of the terminal 114 which winds or turns one way and then another. In the case of a differential coreless magnetic field sensor 102, the sensor 102 has sensing elements 132, 136 positioned adjacent opposite sides of the serpentine region 400 of the AC output terminal 114. In the case of a single-ended coreless magnetic field sensor 102, one of the sensing elements 132 (or 136) shown in FIG. 5 is omitted. In either case, the recess 118 of the mold compound 108 is near the serpentine region 400 of the AC output terminal 114 and the (differential or single-ended)

coreless magnetic field sensor 102 is disposed in the recess 118 of the mold compound 108, e.g., as shown in FIG. 1 and FIGS. 3A-3C.

The embodiments described above provide a lateral-type integration of a coreless magnetic field sensor which provides a minimum solution height and maximum field sensing. However, the lateral-type integrated sensing structure may create a significant bottleneck for the current in the AC output terminal of the semiconductor module. The resulting higher power dissipation may limit the maximum output current capability of the semiconductor module. Describe next is an embodiment of a semiconductor module having a vertical-type integration of a coreless magnetic field sensor. The vertical-type inserted sensing structure offers lower insertion resistance at the expense of reduced sensing field strength.

Figure 6:
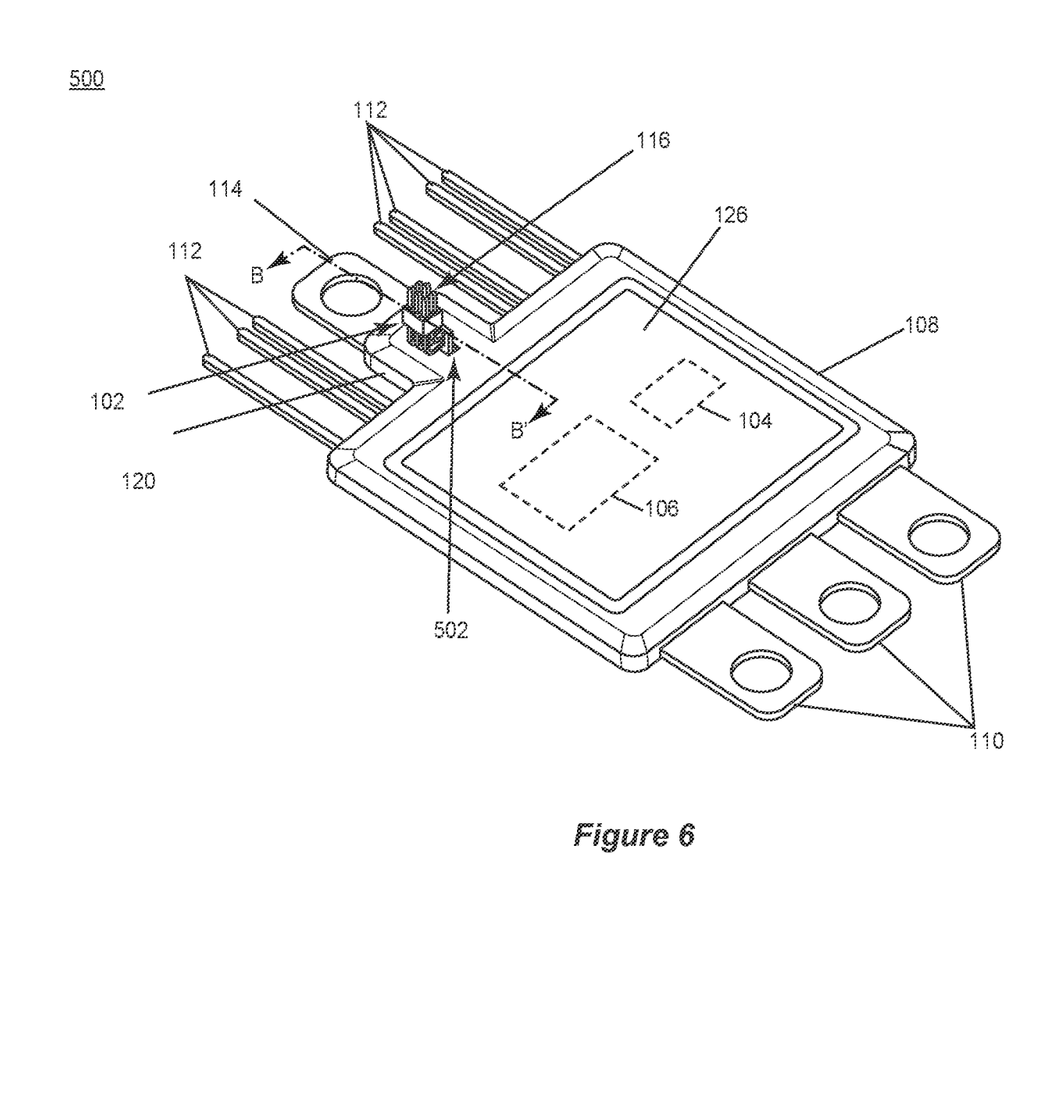
FIG. 6 illustrates perspective view of another embodiment of a semiconductor module having a coreless magnetic field sensor.

FIG. 6 illustrates another embodiment of a semiconductor module 500 with an integrated, coreless, open-loop current sensor 102. The embodiment illustrated in FIG. 6 is similar to the embodiment illustrated in FIG. 1. Different, however, the constricted region 134 of the AC output terminal 114 is a region of the terminal having an opening which is out of view in FIG. 6. According to this embodiment, the mold compound 108 has an opening 502 aligned with the opening in the AC output terminal 114. The coreless magnetic field sensor 102 is disposed in the opening 502 of the mold compound 108. The mold compound 108 covers the sidewall of the opening in the AC output terminal 114, thereby isolating the coreless magnetic field sensor 102 from the sidewall of the opening in the AC output terminal 114. In one embodiment, the mold compound 108 has a protrusion 120 which covers more of the AC output terminal 114 than other ones of the terminals 112 protruding from the same side of the mold compound 108 as the AC output terminal 114. The opening 502 of the mold compound 108 is formed in the protrusion 120.

The method illustrated in FIG. 2 may be used to manufacture the semiconductor module 500 shown in FIG. 6. Different, however, the coreless magnetic field sensor 102 is placed in the opening 502 of the mold compound 108 instead of a recess. The coreless magnetic field sensor 102 may be secured by in the opening 502 of the mold compound 108 by glue, adhesive tape, etc., or clipped in place by the opening 502.

Figure 7A:
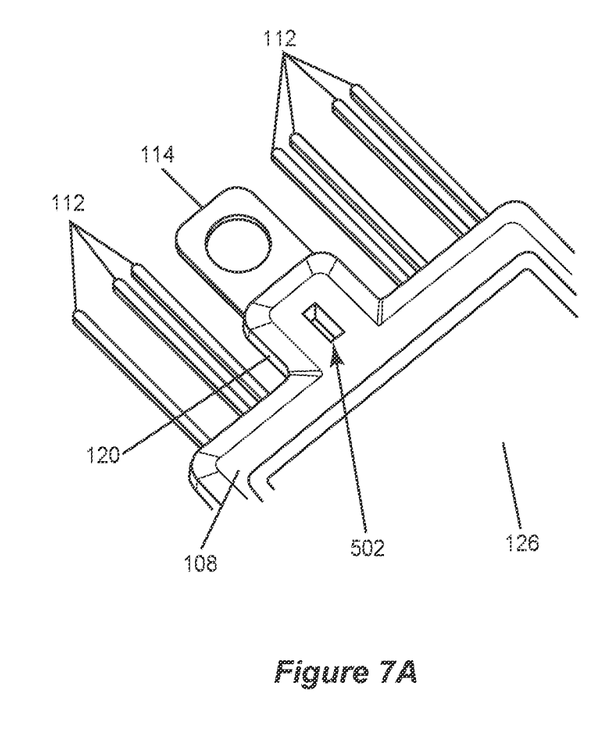
FIG. 7A illustrates an enlarged view of a section of the semiconductor module of FIG. 6 before the coreless magnetic field sensor is disposed in an opening of the mold compound.
Figure 7B:
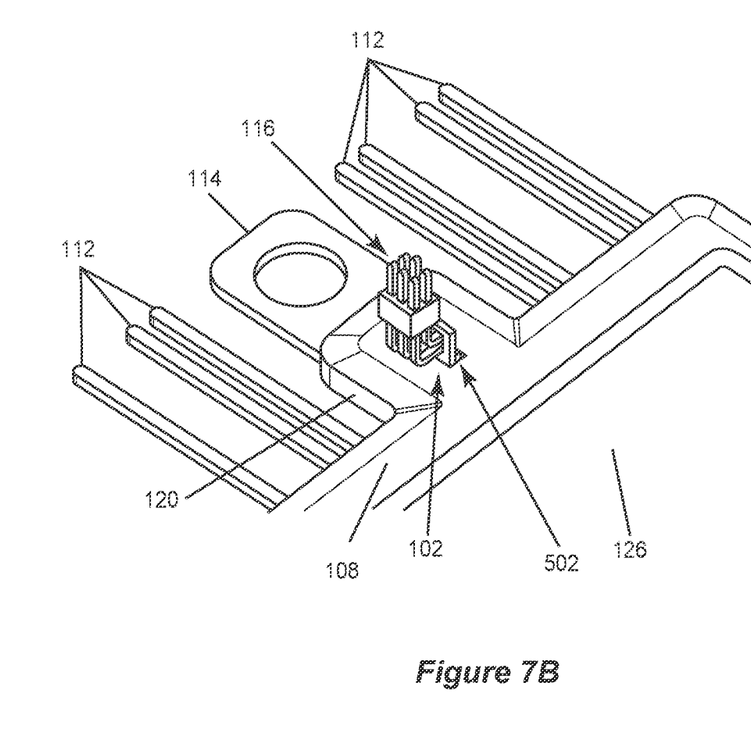
FIG. 7B shows the same view of the semiconductor module as in FIG. 7A, but after the coreless magnetic field sensor is disposed in the recess.
Figure 7C:
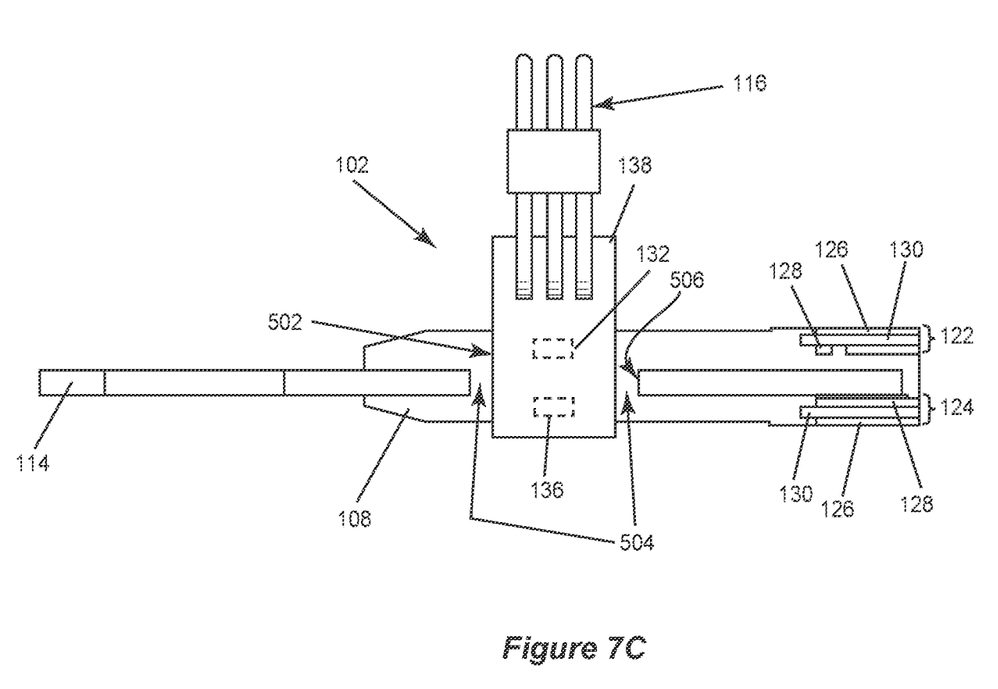
FIG. 7C illustrates a partial cross-sectional view of the semiconductor module along the line labelled B-B' in FIG. 6.

FIG. 7A illustrates an enlarged view of a section of the semiconductor module 500 shown in FIG. 6 before the coreless magnetic field sensor 102 is disposed in the opening 502 of the mold compound 108. FIG. 7B shows the same view of the semiconductor module 500 as in FIG. 3A, but after the coreless magnetic field sensor 102 is disposed in the opening 502 of the mold compound 108. FIG. 7C shows a partial cross-sectional view of the semiconductor module 500 along the line labelled B-B' in FIG. 6.

Figure 7D:
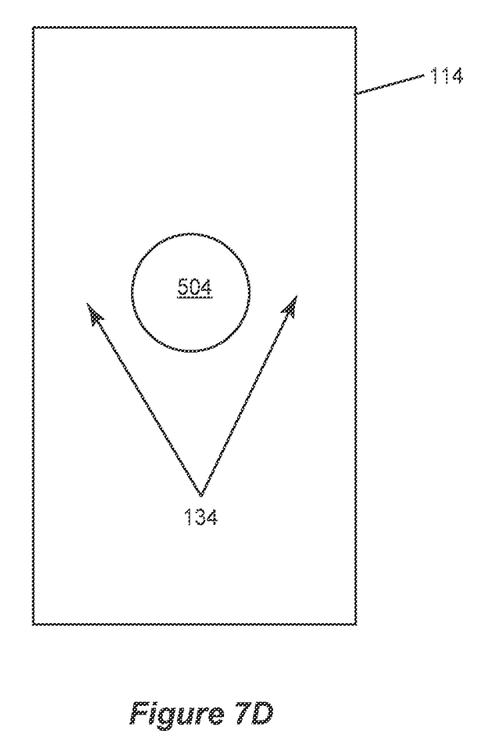
FIG. 7D illustrates a top plan view of an embodiment of a terminal of the semiconductor module of FIG. 6 having an opening for receiving the coreless magnetic field sensor.

In one embodiment, the coreless magnetic field sensor 102 is a differential sensor disposed in the opening 502 of the mold compound 108 and having a first sensing element 132 positioned above the opening 504 in the AC output terminal 114 of the semiconductor module 500 and a second sensing element 136 positioned below the opening 504 in the AC output terminal 114. In another embodiment, the coreless magnetic field sensor 102 is a single-ended sensor. According to this embodiment, one of the sensing elements 132 (or 136) shown in FIG. 7C is omitted. In either the differential or single-ended case, each sensing element 132, 136 of the coreless magnetic field sensor 102 is isolated from the sidewall 506 of the opening 504 in the AC output terminal 114 by the mold compound 108 to ensure proper electrical isolation and accurate sensing of the current flowing in the constricted region 134 of the AC output terminal. FIG. 7D shows the part of the AC output terminal 114 covered by the mold compound 108 and having the opening 504 in which the coreless magnetic field sensor 102 is inserted. The mold compound 108 is not shown in FIG. 7D to provide an unobstructed view of the opening 504 and corresponding constricted region 134.

Figure 8:
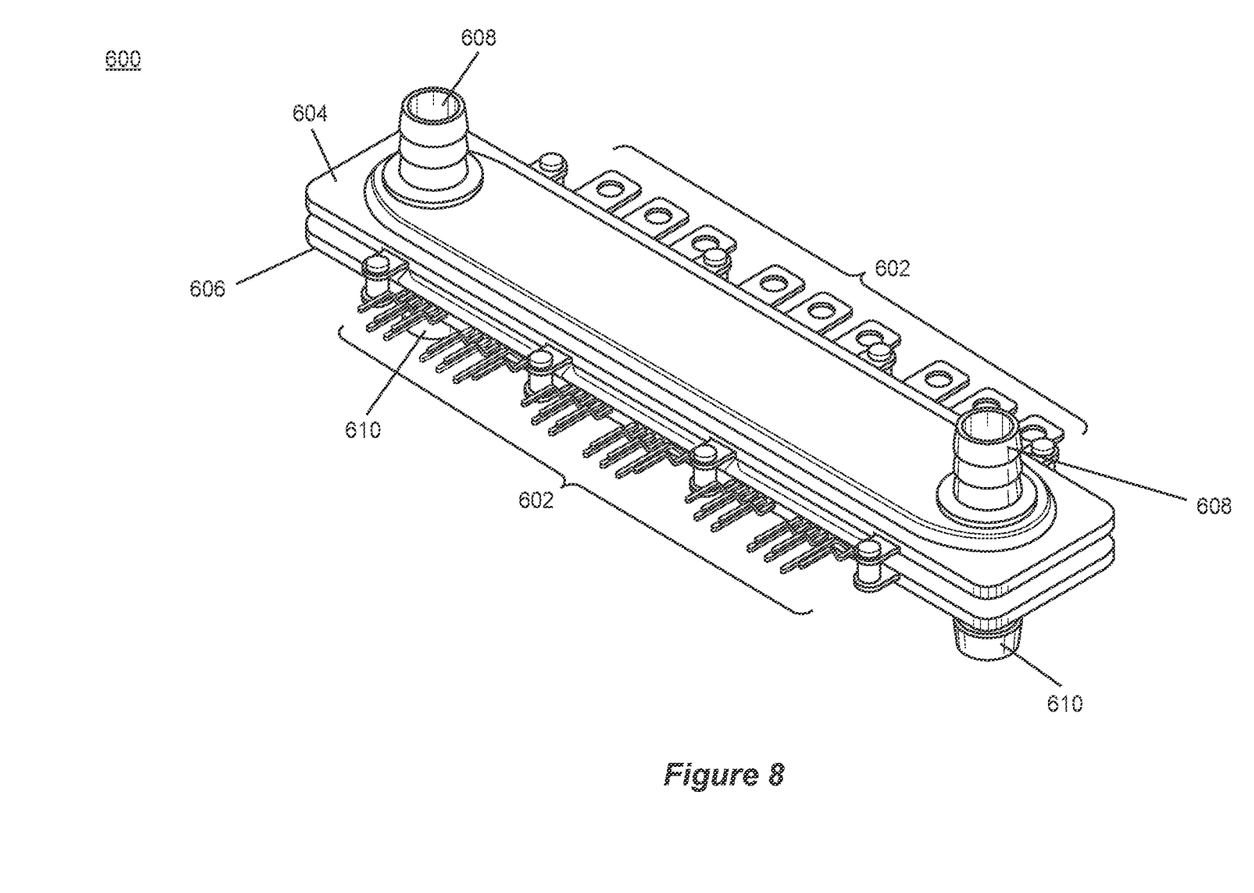
FIG. 8 illustrates perspective view of an embodiment of a cooling system having a plurality of individual semiconductor modules each with an integrated, coreless magnetic field sensor.

FIG. 8 illustrates an embodiment of a cooling system 600 that includes a plurality of individual semiconductor modules of the kind previously described herein. The individual semiconductor modules are out of view in FIG. 8, and may have the lateral-type integrated sensing structure as shown in FIGS. 1 and 3A-3C or the vertical-type integrated sensing structure as shown in FIGS. 6 and 7A-7C. That is, each individual semiconductor module may include one or more semiconductor dies, a mold compound encasing each semiconductor die, a plurality of terminals 602 electrically connected to the semiconductor die(s) and protruding out of the mold compound, wherein a first one of the terminals has a constricted region covered by the mold compound, wherein the mold compound has a recess or an opening near the constricted region of the first terminal, and a coreless magnetic field sensor disposed in the recess or the opening of the mold compound and isolated from the first terminal by the mold compound. The coreless magnetic sensor is configured to generate a signal in response to a magnetic field produced by current flowing in the constricted region of the first terminal, the magnitude of the signal being proportional to the amount of current flowing in the constricted region of the first terminal, as previously explained herein.

The cooling system 600 further includes a first lid 604 joined to a second lid 606 to form a sealed housing. The sealed housing includes the individual semiconductor modules and a cavity between the lids and the individual semiconductor modules. The cavity is out of view in FIG. 8. The first lid 604 has one or more ports 608 and the second lid 606 has one or more ports 610, so that fluid such as water, a coolant, etc. can flow in the cavity between the lids 604, 606 and the individual semiconductor modules. In the case of double-sided cooling, the fluid may flow along both main sides of the individual semiconductor modules. In the case of single-sided cooling, the fluid may flow along only the main side of the individual semiconductor modules with the cooling structure. The lid 604, 606 adjacent the side of the individual semiconductor modules without a cooling structure may not have any ports. The lids 604, 606 may be made of metal or plastic, or a combination of metal and plastic.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module, comprising:
a semiconductor die;
a mold compound encasing the semiconductor die;
a plurality of terminals electrically connected to the semiconductor die and protruding out of the mold compound, wherein a first one of the terminals has a constricted region covered by the mold compound, wherein the mold compound has a recess or an opening near the constricted region of the first terminal; and
a coreless magnetic field sensor disposed in the recess or the opening of the mold compound and isolated from the first terminal by the mold compound, the coreless magnetic sensor configured to generate a signal in response to a magnetic field produced by current flowing in the constricted region of the first terminal, the magnitude of the signal being proportional to the amount of current flowing in the constricted region of the first terminal.

2. The semiconductor module of claim 1, wherein the coreless magnetic field sensor is a magnetoresistive sensor or a Hall sensor.

3. The semiconductor module of claim 1, wherein the constricted region of the first terminal comprises a tapered region over which the width of the first terminal narrows, wherein the recess of the mold compound is near the tapered region of the first terminal, wherein the coreless magnetic field sensor is a single-ended sensor disposed in the recess of the mold compound and comprises a single sensing element positioned adjacent one side of the tapered region, and wherein the single sensing element is isolated from the tapered region by the mold compound.

4. The semiconductor module of claim 1, wherein the constricted region of the first terminal comprises a tapered region over which the width of the first terminal narrows, wherein the recess of the mold compound is near the tapered region of the first terminal, wherein the coreless magnetic field sensor is a differential sensor disposed in the recess of the mold compound and comprises a first sensing element positioned adjacent a first side of the tapered region and a second sensing element positioned adjacent a second side of the tapered region opposite the first side, and wherein the first and second sensing elements are isolated from the tapered region by the mold compound.

5. The semiconductor module of claim 1, wherein the constricted region of the first terminal comprises a serpentine region, wherein the recess of the mold compound is near the serpentine region of the first terminal, wherein the coreless magnetic field sensor is a single-ended sensor disposed in the recess of the mold compound and comprises a single sensing element positioned adjacent one side of the serpentine region, and wherein the single sensing element is isolated from the serpentine region by the mold compound.

6. The semiconductor module of claim 1, wherein the constricted region of the first terminal comprises a serpentine region, wherein the recess of the mold compound is near the serpentine region of the first terminal, wherein the coreless magnetic field sensor is a differential sensor disposed in the recess of the mold compound and comprises a first sensing element positioned adjacent a first side of the serpentine region and a second sensing element positioned adjacent a second side of the serpentine region opposite the first side, and wherein the first and second sensing elements are isolated from the serpentine region by the mold compound.

7. The semiconductor module of claim 1, wherein the constricted region of the first terminal comprises a region of the first terminal having an opening, wherein the opening of the mold compound is aligned with the opening in the first terminal, wherein the coreless magnetic field sensor is a single-ended sensor disposed in the opening of the mold compound and comprises a single sensing element positioned above or below the opening in the first terminal, and wherein the single sensing element is isolated from a sidewall of the opening in the first terminal by the mold compound.

8. The semiconductor module of claim 1, wherein the constricted region of the first terminal comprises a region of the first terminal having an opening, wherein the opening of the mold compound is aligned with the opening in the first terminal, wherein the coreless magnetic field sensor is a differential sensor disposed in the opening of the mold compound and comprises a first sensing element positioned above the opening in the first terminal and a second sensing element positioned below the opening in the first terminal, and wherein the first and second sensing elements are isolated from a sidewall of the opening in the first terminal by the mold compound.

9. The semiconductor module of claim 1, wherein the mold compound has a protrusion which covers more of the first terminal than other ones of the terminals protruding from a same side of the mold compound as the first terminal, and wherein the recess or the opening of the mold compound is formed in the protrusion.

10. The semiconductor module of claim 1, wherein the semiconductor die is a power semiconductor die, wherein the semiconductor module has double-sided cooling, and wherein the first terminal is an AC output terminal of the power semiconductor die.

11. A cooling system, comprising:
a plurality of individual semiconductor modules each comprising: a semiconductor die; a mold compound encasing the semiconductor die; a plurality of terminals electrically connected to the semiconductor die and protruding out of the mold compound, wherein a first one of the terminals has a constricted region covered by the mold compound, wherein the mold compound has a recess or an opening near the constricted region of the first terminal; and a coreless magnetic field sensor disposed in the recess or the opening of the mold compound and isolated from the first terminal by the mold compound, the coreless magnetic sensor configured to generate a signal in response to a magnetic field produced by current flowing in the constricted region of the first terminal, the magnitude of the signal being proportional to the amount of current flowing in the constricted region of the first terminal; and
a first lid joined to a second lid to form a sealed housing which includes the plurality of individual semiconductor modules and a cavity between the lids and the individual semiconductor modules for fluid flow via a plurality of ports formed in the first and/or second lid.

12. The cooling system of claim 11, wherein each coreless magnetic field sensor is a magnetoresistive sensor or a Hall sensor.

13. The cooling system of claim 11, wherein the constricted region of each first terminal comprises a tapered region over which the width of the first terminal narrows, wherein the recess of the mold compound is near the tapered region of the first terminal, wherein the coreless magnetic field sensor is a single-ended sensor disposed in the recess of the mold compound and comprises a single sensing element positioned adjacent one side of the tapered region, and wherein the single sensing element is isolated from the tapered region by the mold compound.

14. The cooling system of claim 11, wherein the constricted region of each first terminal comprises a tapered region over which the width of the first terminal narrows, wherein the recess of the mold compound is near the tapered region of the first terminal, wherein the coreless magnetic field sensor is a differential sensor disposed in the recess of the mold compound and comprises a first sensing element positioned adjacent a first side of the tapered region and a second sensing element positioned adjacent a second side of the tapered region opposite the first side, and wherein the first and second sensing elements are isolated from the tapered region by the mold compound.

15. The cooling system of claim 11, wherein the constricted region of each first terminal comprises a serpentine region, wherein the recess of the mold compound is near the serpentine region of the first terminal, wherein the coreless magnetic field sensor is a single-ended sensor disposed in the recess of the mold compound and comprises a single sensing element positioned adjacent one side of the serpentine region, and wherein the single sensing element is isolated from the serpentine region by the mold compound.

16. The cooling system of claim 11, wherein the constricted region of each first terminal comprises a serpentine region, wherein the recess of the mold compound is near the serpentine region of the first terminal, wherein the coreless magnetic field sensor is a differential sensor disposed in the recess of the mold compound and comprises a first sensing element positioned adjacent a first side of the serpentine region and a second sensing element positioned adjacent a second side of the serpentine region opposite the first side, and wherein the first and second sensing elements are isolated from the serpentine region by the mold compound.

17. The cooling system of claim 11, wherein the constricted region of each first terminal comprises a region of the first terminal having an opening, wherein the opening of the mold compound is aligned with the opening in the first terminal, wherein the coreless magnetic field sensor is a single-ended sensor disposed in the opening of the mold compound and comprises a single sensing element positioned above or below the opening in the first terminal, and wherein the single sensing element is isolated from a sidewall of the opening in the first terminal by the mold compound.

18. The cooling system of claim 11, wherein the constricted region of each first terminal comprises a region of the first terminal having an opening, wherein the opening of the mold compound is aligned with the opening in the first terminal, wherein the coreless magnetic field sensor is a differential sensor disposed in the opening of the mold compound and comprises a first sensing element positioned above the opening in the first terminal and a second sensing element positioned below the opening in the first terminal, and wherein the first and second sensing elements are isolated from a sidewall of the opening in the first terminal by the mold compound.

19. The cooling system of claim 11, wherein the mold compound of each individual semiconductor module has a protrusion which covers more of the first terminal than other ones of the terminals protruding from a same side of the mold compound as the first terminal, and wherein the recess or the opening of the mold compound is formed in the protrusion.

20. The cooling system of claim 11, wherein each semiconductor die is a power semiconductor die, wherein each individual semiconductor module has double-sided cooling, and wherein each first terminal is an AC output terminal of the power semiconductor die.

21. A method of manufacturing a semiconductor module, the method comprising:

electrically connecting a plurality of terminals to a semiconductor die;

molding the plurality of terminals and the semiconductor die so that the semiconductor die is encased in a mold compound and the plurality of terminals protrude out of the mold compound, wherein a first one of the terminals has a constricted region covered by the mold compound, wherein the mold compound has a recess or an opening near the constricted region of the first terminal; and placing a coreless magnetic field sensor in the recess or the opening of the mold compound, the coreless magnetic field sensor being isolated from the first terminal by the mold compound and configured to generate a signal in response to a magnetic field produced by current flowing in the constricted region of the first terminal, the magnitude of the signal being proportional to the amount of current flowing in the constricted region of the first terminal.

* * * * *